United States Patent [19]

Stillman

[11] 4,258,652

[45] Mar. 31, 1981

[54] DIP TOP COATING APPARATUS

[76] Inventor: Ben S. Stillman, 11165 La Paloma Dr., Cupertino, Calif. 95014

[21] Appl. No.: 44,371

[22] Filed: Jun. 1, 1979

[51] Int. Cl.³ ............................................. B05C 1/02
[52] U.S. Cl. ................................... 118/249; 101/37; 118/262
[58] Field of Search ............. 118/236, 211, 249, 212, 118/247, 241, 243, 262; 101/37

[56] References Cited

U.S. PATENT DOCUMENTS

| | | | |
|---|---|---|---|
| 698,962 | 4/1902 | Julian | 118/249 |
| 930,911 | 8/1909 | Wright | 118/249 X |
| 3,239,367 | 3/1966 | Demeter | 118/262 X |
| 3,688,735 | 9/1972 | Brenner | 118/262 X |
| 4,029,833 | 6/1977 | Kosta | 118/262 X |

Primary Examiner—John P. McIntosh
Attorney, Agent, or Firm—Claude A. S. Hamrick

[57] ABSTRACT

A DIP top coating apparatus including a gravity-fed rail along which DIPs may slide, a continuously running inking mechanism disposed above said rail for applying ink to the tops of DIPs passing thereunder, and means disposed beneath said rail for insuring that proper contact is made between the inking apparatus and the DIP tops.

8 Claims, 3 Drawing Figures

4,258,652

DIP TOP COATING APPARATUS

BACKGROUND OF THE INVENTION

1. Field of the Invention

The present invention relates generally to DIP-handling and processing apparatus and more particularly to a device for preparing previously marked DIPs for remarking.

2. Description of the Prior Art

Heretofore, when dual in-line packaged (DIP) devices were either mismarked or for some reason it was desirable that they be remarked to reflect a new identifying number, company logo or the like, the DIPs had to be manually prepared by overpainting with a hand roller, brush, etc., or by erasing the existing marking. This is, of course, inefficient, costly and inconsistent. In view of the fact that the volume of components which might require remarking can easily reach several hundred thousand, this means that a completely inordinant expense is required in order to remark the devices.

SUMMARY OF THE PRESENT INVENTION

It is therefore a principal object of the present invention to provide a means which once loaded will automatically feed and coat the top surfaces of DIPs in preparation for remarking.

Another object of the present invention is to provide a device which can be combined with other processing apparatus to provide a system for automatically feeding, coating, remarking and otherwise repackaging DIP components at high volume with consistent and uniform production throughput.

Briefly, a preferred embodiment of the present invention includes a gravity-fed rail along which DIPs may slide, a continuously running inking mechanism disposed above said rail for applying ink to the tops of DIPs passing thereunder, and means disposed beneath said rail for insuring that proper contact is made between the inking apparatus and the DIP tops.

A principal advantage of the present invention is that it provides a highly versatile device for automatically accomplishing an end which heretofore could only be accomplished manually.

Another advantage of the present invention is that it provides a means which can be combined with other apparatus in a process line to either coat or recoat the top of DIPs so that they may be remarked.

These and other objects and advantages of the present invention will no doubt become apparent to those of ordinary skill in the art after having read the following detailed description of the preferred embodiment.

IN THE DRAWING

DETAILED DESCRIPTION OF THE PREFERRED EMBODIMENT

Figures 1, 2, 3:
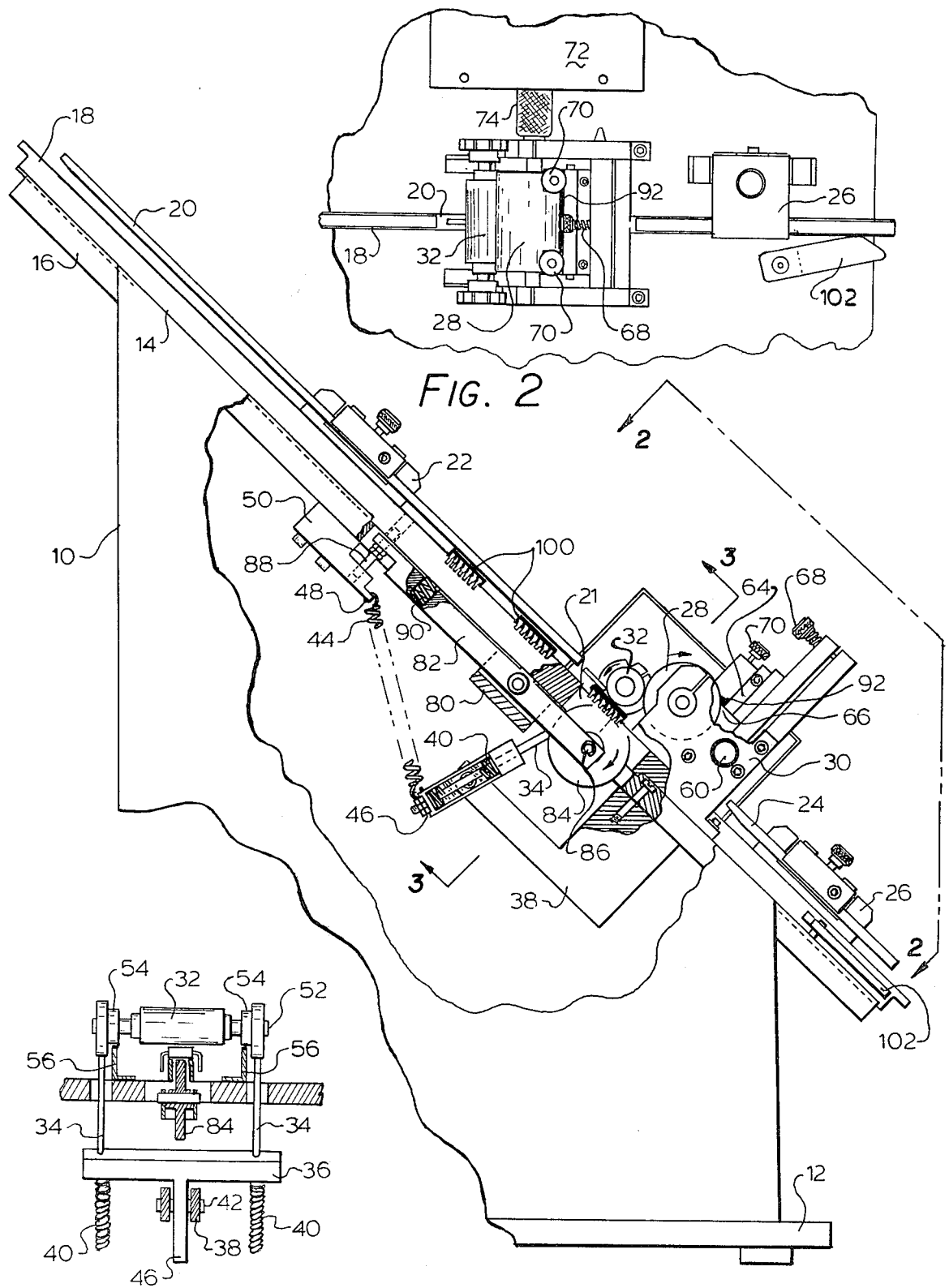
FIG. 1 is a partially broken side view showing a preferred embodiment of a DIP top coating apparatus in accordance with the present invention.
FIG. 2 is a top view taken along the line 2—2 of FIG. 1.
FIG. 3 is a cross section taken along the line 3—3 of FIG. 1.

Referring now to FIG. 1 of the drawing, which is a side elevation of a preferred embodiment of the invention broken away to reveal the principal operative components thereof, it will be noted that the apparatus includes a support chassis and housing 10 which is mounted to a base 12 and has an inclined upper surface that is formed by the top of a rail plate 16. Affixed to rail plate 16 is a continuous rail 18 which has a short slot formed therein as illustrated at 21. Disposed above the upper end of a rail 18 in variable spaced-apart relationship is a guide bar 20 which is supported by an adjustable holder 22 that is affixed to rail plate 16. Positioned at the other end of rail 18 is a similar guide bar 24 of shorter length than guide bar 20 held in place by second holder 26.

Disposed at an inking station located between the facing ends of the bars 20 and 24 is an inking mechanism including an ink roller 28 rotatably mounted to a support frame 30 which is affixed to rail plate 16, a transfer roller 32 which is journalled to a pair of pivot arms 34 (see FIG. 3) that are themselves telescopically affixed to a member 36 which is pivotally attached to a bracket 38 secured to the bottom of rail plate 16.

The ends of the arms 34 are biased downwardly relative to member 36 by springs 40, and an assembly including roller 32, arms 34, member 36 and springs 40 are rotationally biased about the pivot pin 42 by a spring 44 having one end attached to member 36 at 46, and the other end attached at 48 to a bracket 50 which is secured to the bottom of rail plate 16. The shaft 52 supporting transfer roller 32 also carries a pair of rollers 54 which ride on short segments of support rail 56 (FIG. 3) affixed to rail plate 16 and allow roller 32 to roll into engagement with roller 28 under the influence of spring 44.

Pivotally affixed at 60 to the side plates 30 is an arm 62 that carries a wiper blade 64, the wiping edge 66 of which engages the surface of roller 28. Separation between the blade edge 66 and the surface of roller 28 is controlled by adjustment screws 68 and 70. Roller 28 is driven at a constant speed by a motor contained within the housing 72 and coupled to the roller by a shaft 74.

Disposed beneath the rail 18 and pivotally secured to the bottom of rail plate 16 by a bracket 80 is an arm 82 having a support wheel 84 journalled to one end thereof at 86. The other end of arm 82 engages an adjustable stop 88 and is spring-loaded relative to rail 18 by a compression spring 90. Note that wheel 84 extends through the opening 21 in rail 18. Stop 88 is adjusted so that wheel 84 extends above the top surface of rail 18 only far enough to ensure that DIPs 100 are lifted high into firm engagement with transfer roller 32.

In operation, transfer roller 32 is pulled back along its support tracks 56 into a position out of engagement with roller 28 and a supply of ink 92 is disposed in the cavity formed at the juncture of roller 28 and blade 92. The drive motor is then energized to drive roller 28 and the blade is adjusted by means of screws 68 and 70 so as to cause roller 28 to be coated with a desired thickness of ink and transfer roller is released and allowed to move back into engagement with roller 28 under the influence of springs 40 and 44. The guide bars 20 and 24 are also positioned so as to be high enough above rail 18 to allow a particular size DIP 100 to freely move along rail 18.

DIPs are then loaded onto the top end of rail 18 and allowed to slide downwardly. As the DIPs move into engagement with support wheel 84, they are biased thereby into engagement with transfer roller 32 and as they pass thereunder are coated with ink that has been transferred from roller 28. The coated DIPs then continue to move along rail 18 for gravity discharge at the lower end.

Upon being discharged from the lower end of rail 18 the DIPs may either move onto the track or rail of a subsequent processing stage or may be loaded into a standard DIP "stick" which is slipped over the lower end of rail 18 and held in place by a spring-loaded arm 102.

Among the advantages of this invention are its mechanical simplicity, the fact that it utilizes gravity feed, has a minimum number of moving parts, and operates at high speed. In addition, it can apply a uniform coating of ink or other covering material to the tops of large quantities of dual in-line packaged devices without operator attention other than loading. Still another advantage is that the device can readily be included in a standard DIP-processing line without requiring modification of the line.

Although the present invention has been described above in terms of a preferred embodiment, it is contemplated that certain alterations and modifications will become apparent to those of ordinary skill in the art after having read the above disclosure. It is therefore intended that the following claims be interpreted as covering all such alterations and modifications as fall within the true spirit and scope of the invention.

What is claimed is:

1. Apparatus for coating the top surface of dual in-line packaged (DIP) devices comprising:
   a support chassis;
   elongated narrow rail means affixed to said chassis and having one end disposed substantially higher than the other, said rail means being adapted to provide a continuous track along which DIPs may move in rail straddling disposition from said one end to the other under the influence of gravity;
   inking means including an inking roller and a transfer roller disposed at an inking station along the length of and above said rail means such that said transfer roller engages the tops of DIPs moving down said rail means; and
   means disposed beneath said rail means for engaging and resiliently urging said DIPs upwardly relative to said rail means and into compressive contact with said transfer roller as they pass thereunder.

2. Apparatus as recited in claim 1 wherein said rail means has an opening extending vertically therethrough at said inking station and immediately beneath the position of said transfer roller, and said means disposed beneath said rail means includes a spring-loaded wheel extending up through said opening to engage the bottom of said DIPs as they pass thereover and to bias the DIPs into engagement with said transfer roller.

3. Apparatus as recited in claim 2 wherein said means disposed beneath said rail means further includes an arm pivotally attached to said chassis and having one end rotatably affixed to said wheel, and spring means for biasing the wheel supporting end of said arm in a direction toward said transfer roller.

4. Apparatus as recited in claims 1, 2 or 3 and further comprising means for resiliently biasing said transfer roller into engagement with said inking roller.

5. Apparatus as recited in claim 4 and further comprising support rails mounted to said chassis and disposed on either side of said rail means and extending upwardly relative thereto for supporting said transfer roller at a predetermined height above said rail means.

6. Apparatus as recited in claim 5 and further including a pair of spring-loaded arms pivotally attached to said chassis with one end of each arm being journalled to said transfer roller, said pair of arms being operative to simultaneously bias said transfer roller downwardly and forwardly into engagement with said inking roller.

7. Apparatus as recited in claims 1, 2 or 3 wherein said inking means includes an adjustable wiper blade for allowing a selected thickness of ink to be applied to said inking roller.

8. Apparatus as recited in claim 7 and further including adjustable guide bar means disposed above said rail means so as to define the upper limits of a passageway through which said DIPs pass.

* * * * *